United States Patent [19]
Ogura

[11] Patent Number: 5,103,316
[45] Date of Patent: Apr. 7, 1992

[54] METHOD FOR THE SIMULTANEOUS OPTICAL STORAGE OF A FIRST IMAGE, OPTICAL RETRIEVAL AND LATENT FORMATION OF A SECOND IMAGE, AND DEVELOPMENT OF A LATENT THIRD IMAGE

[75] Inventor: Mitsuru Ogura, Nara, Japan

[73] Assignee: Sharp Kabushiki Kaisha, Osaka, Japan

[21] Appl. No.: 409,433

[22] Filed: Sep. 19, 1989

[30] Foreign Application Priority Data

Sep. 22, 1988 [JP] Japan .................. 63-238173

[51] Int. Cl.[5] ............... H04N 1/036; B41J 2/445; B41J 2/47; G02F 1/13
[52] U.S. Cl. .................. 358/302; 346/107 R; 359/43
[58] Field of Search ............ 358/302, 75, 298; 346/107 R, 108, 160, 157; 355/32, 71; 350/351

[56] References Cited
U.S. PATENT DOCUMENTS
4,965,672 10/1990 Duke .................. 358/298

FOREIGN PATENT DOCUMENTS
0291300 11/1988 European Pat. Off. ........ 346/107 R
6420773 5/1963 Japan .
54140542 10/1979 Japan .

OTHER PUBLICATIONS

"Laser Addressed Liquid Crystal Light Modulators for Color Electronic Imaging with Mead Microencapsulated Paper", Charles Davis, SID Digest 1987, pp. 367–370.

Primary Examiner—Benjamin R. Fuller
Assistant Examiner—Scott A. Rogers
Attorney, Agent, or Firm—Morrison & Foerster

[57] ABSTRACT

A method for the formation of images utilizing a plurality of optical image memories into each of which image information is written and from each of which said image information is read out sequentially to obtain image-information light that is used for the formation of images; wherein said image information written into one of said optical image memories is read out therefrom at the time when other image information is being written into another predetermined optical image memory.

8 Claims, 15 Drawing Sheets

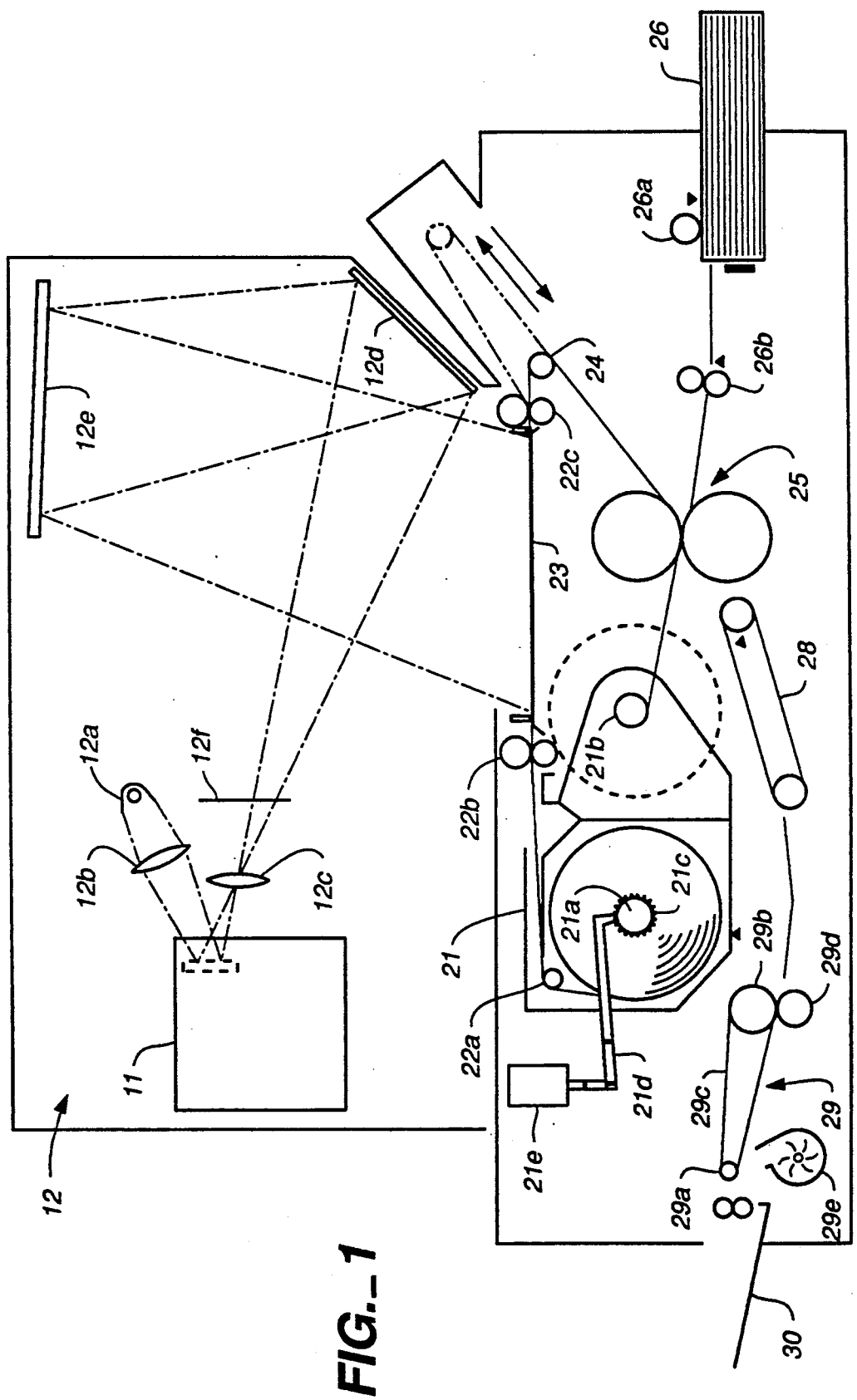
FIG._1

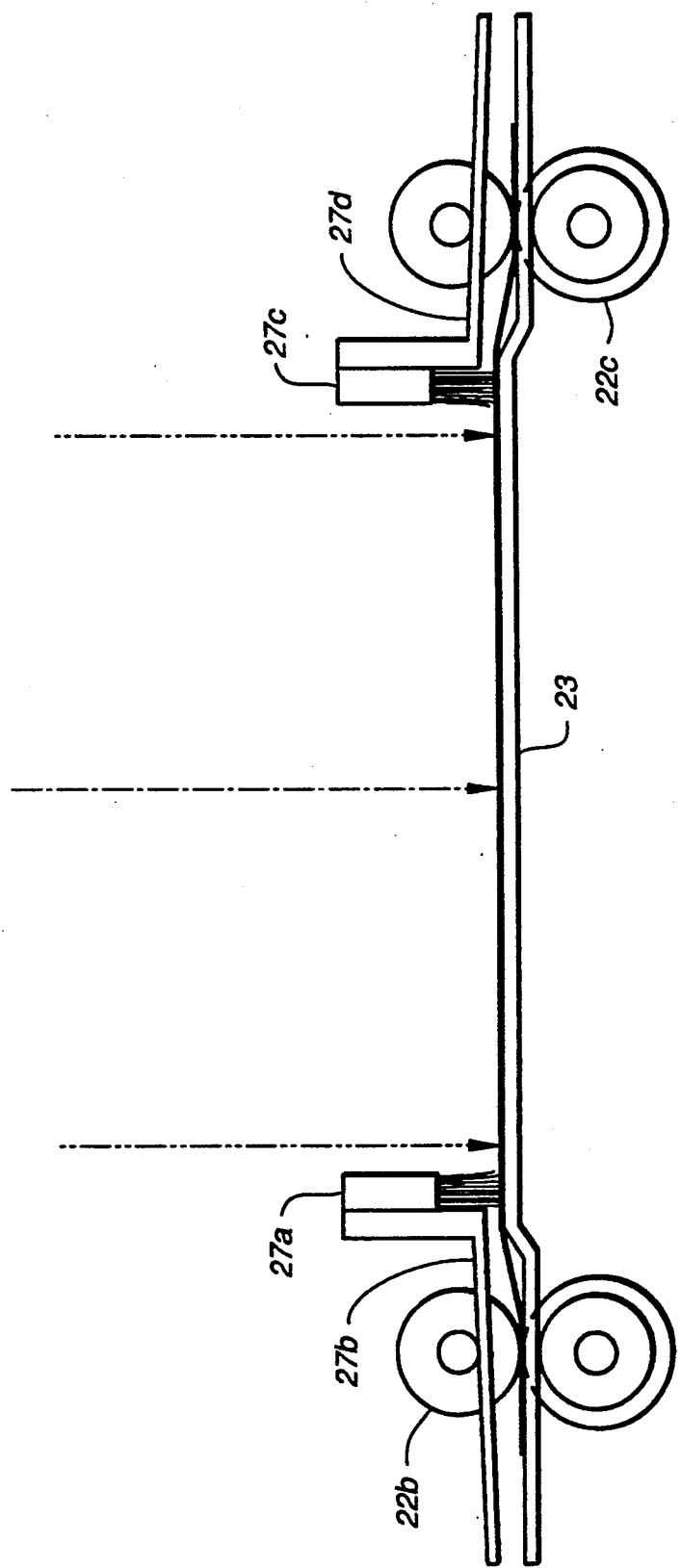
FIG._2

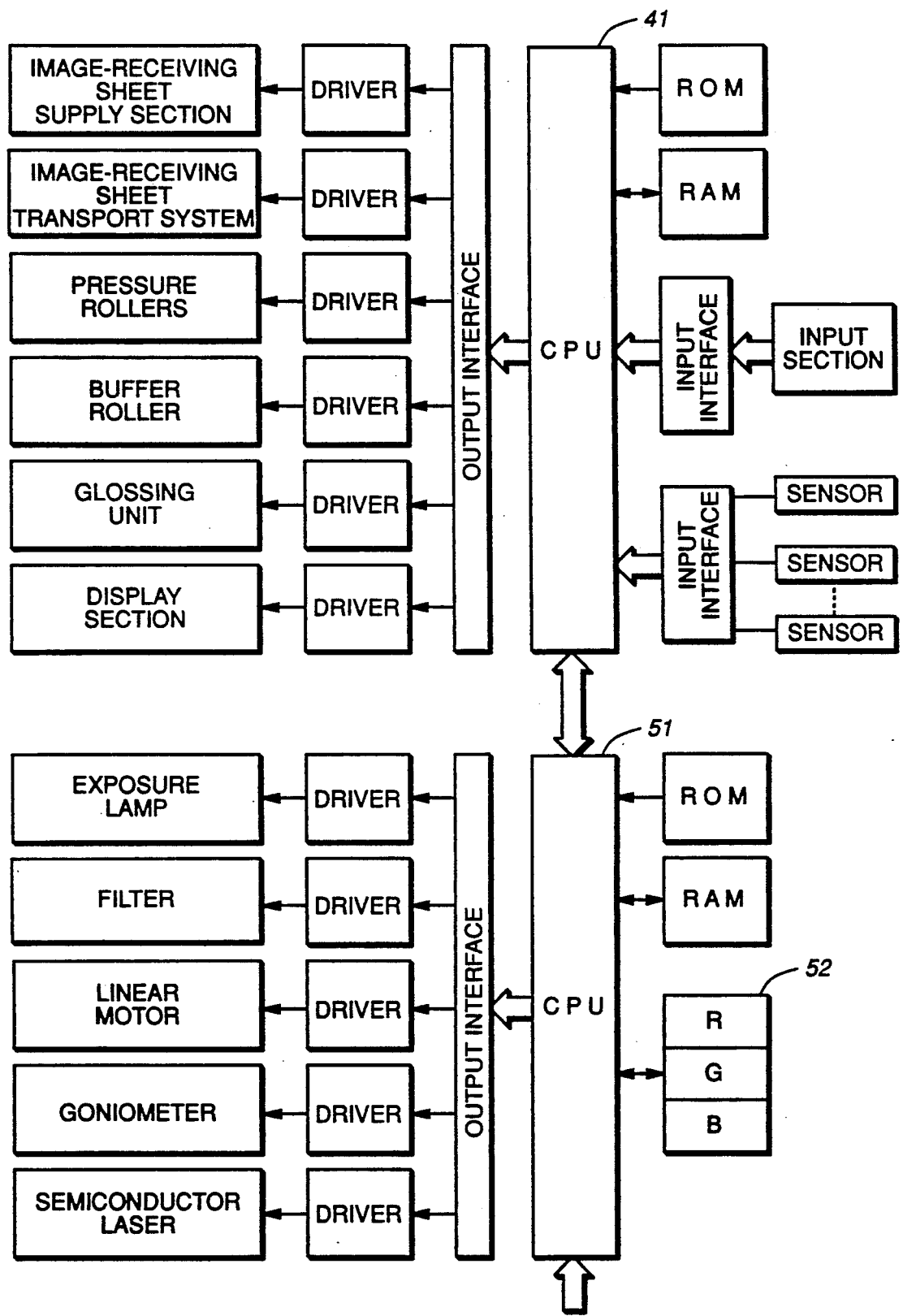
FIG._3

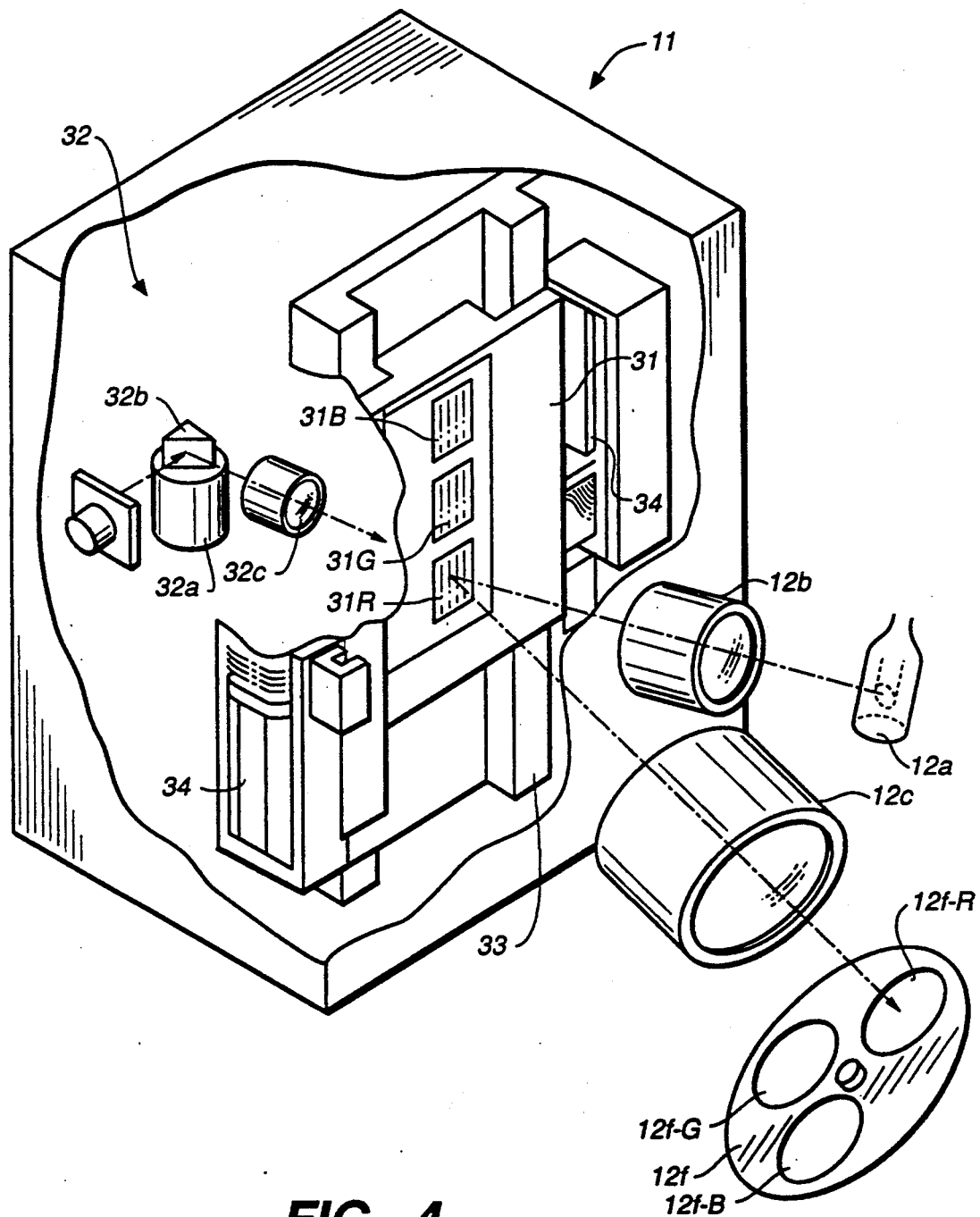
FIG._4

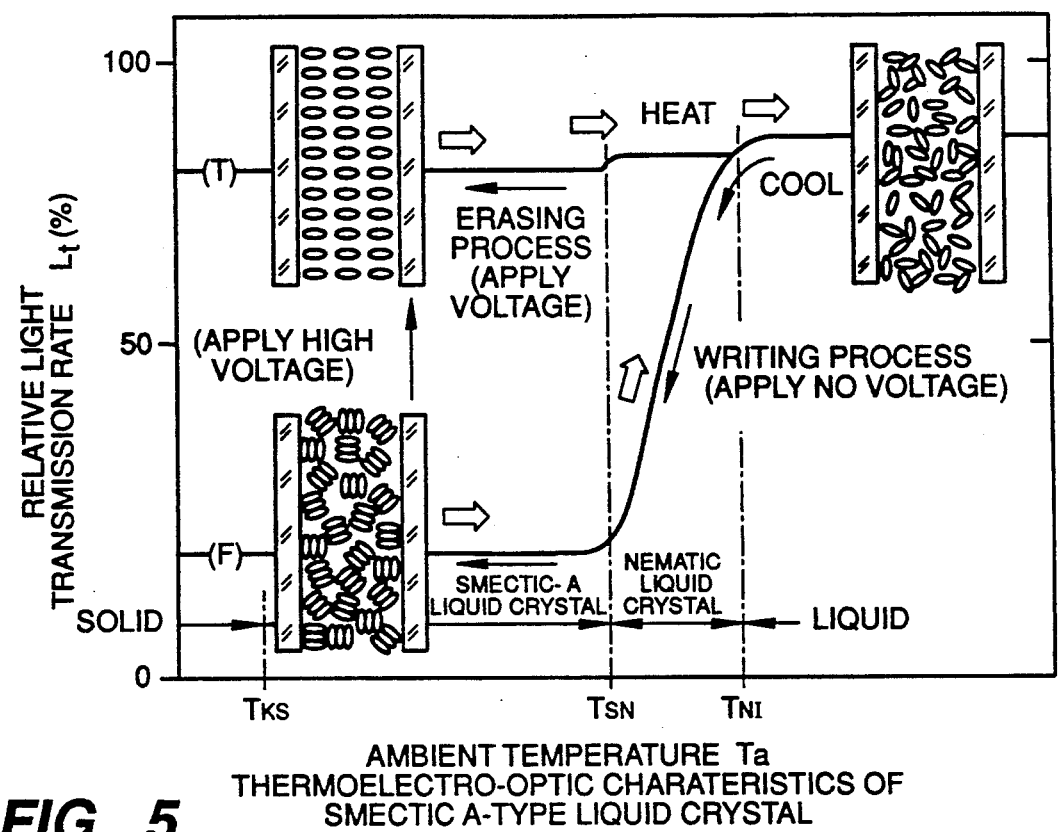
FIG._5
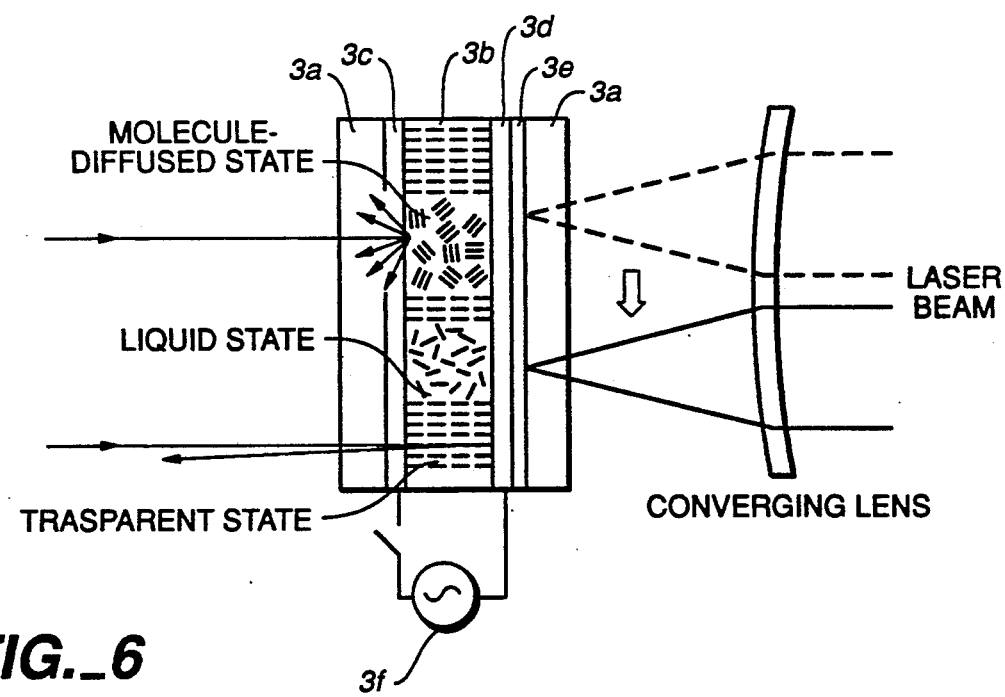
FIG._6

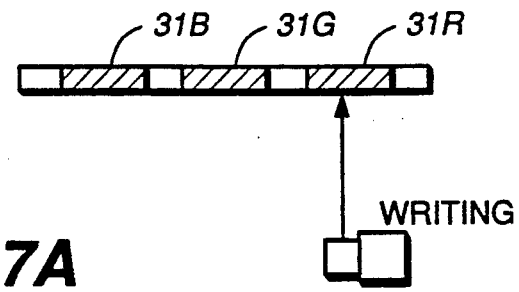
FIG._7A
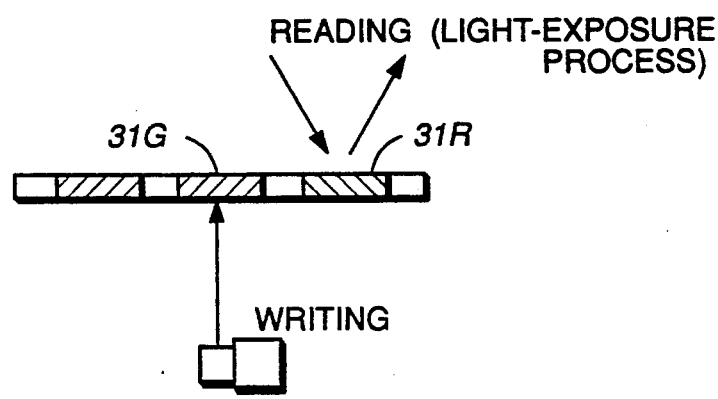
FIG._7B
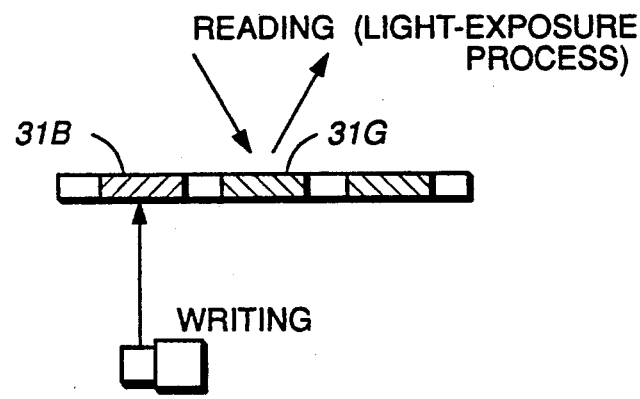
FIG._7C
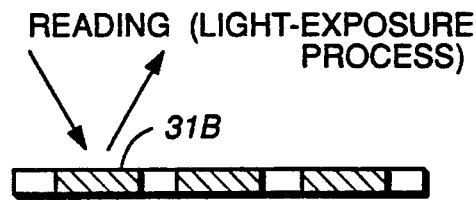
FIG._7D

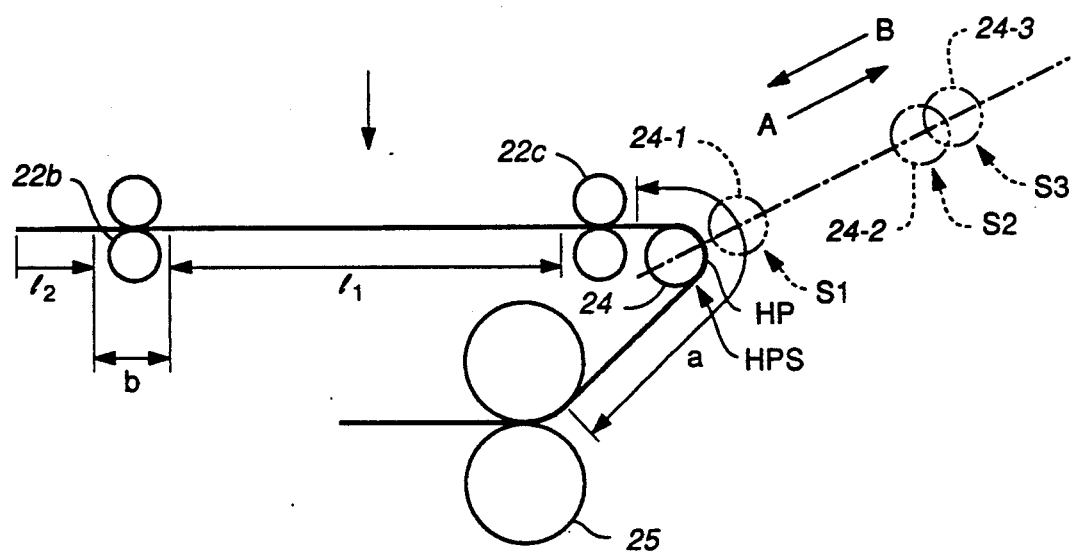
FIG._8A
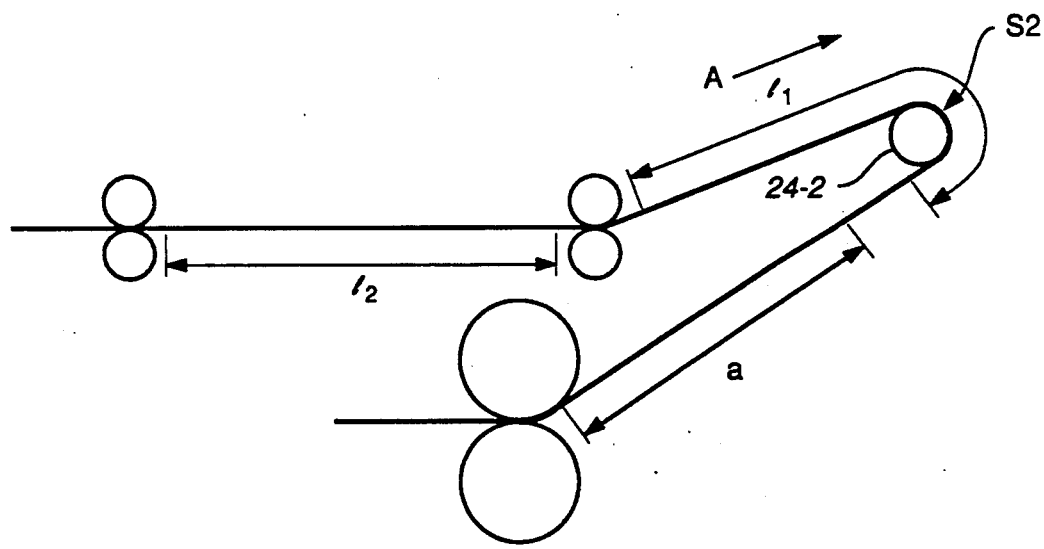
FIG._8B

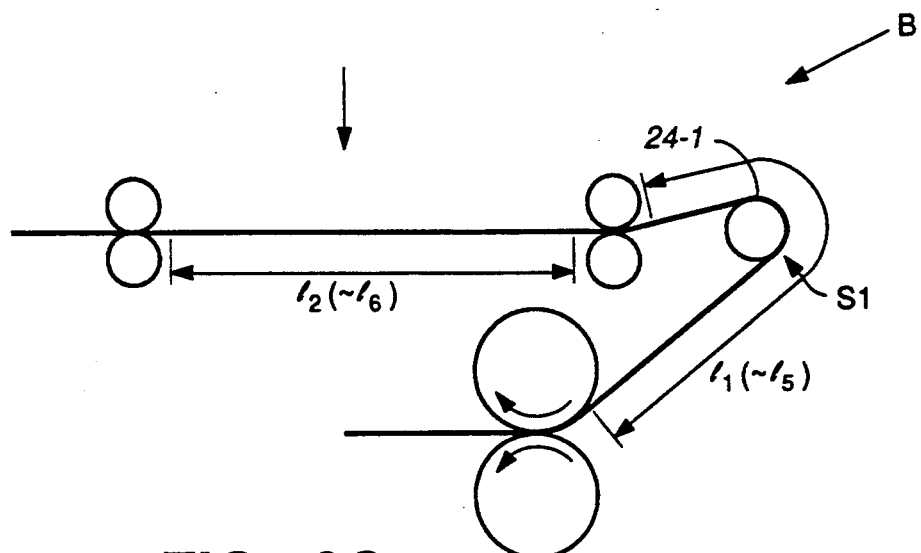
FIG._8C
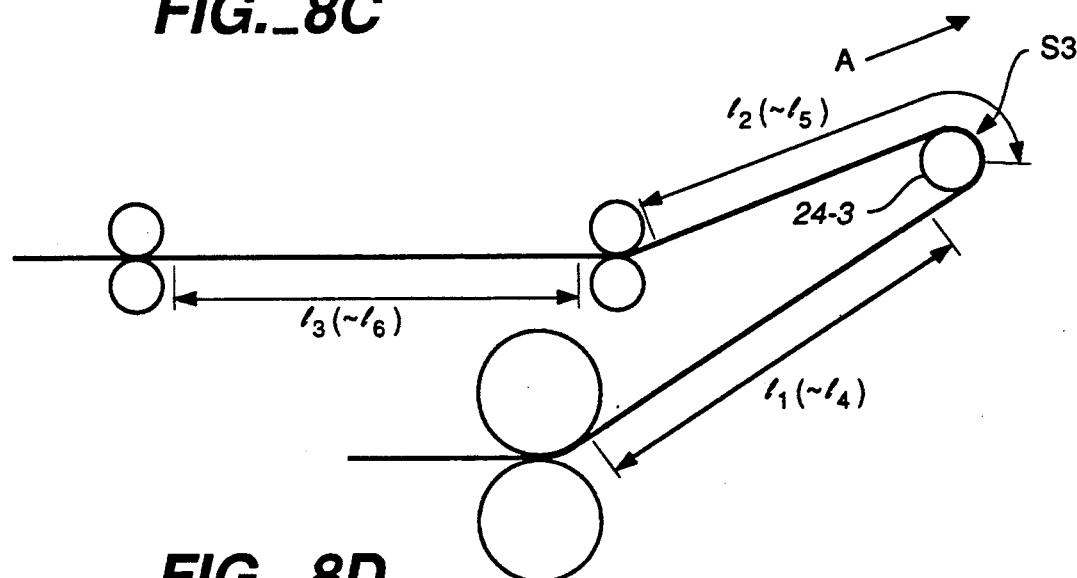
FIG._8D
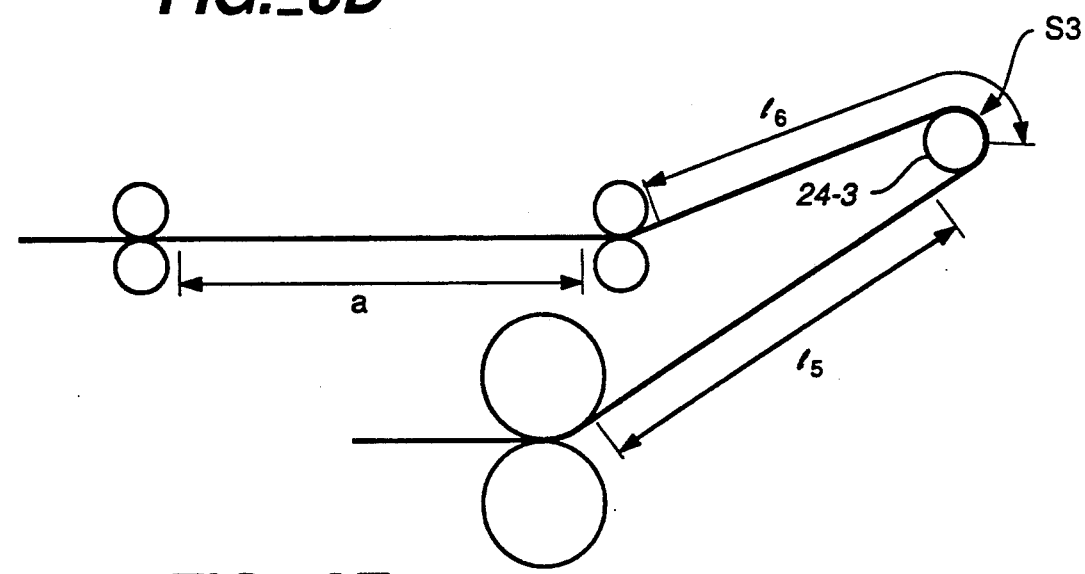
FIG._8E

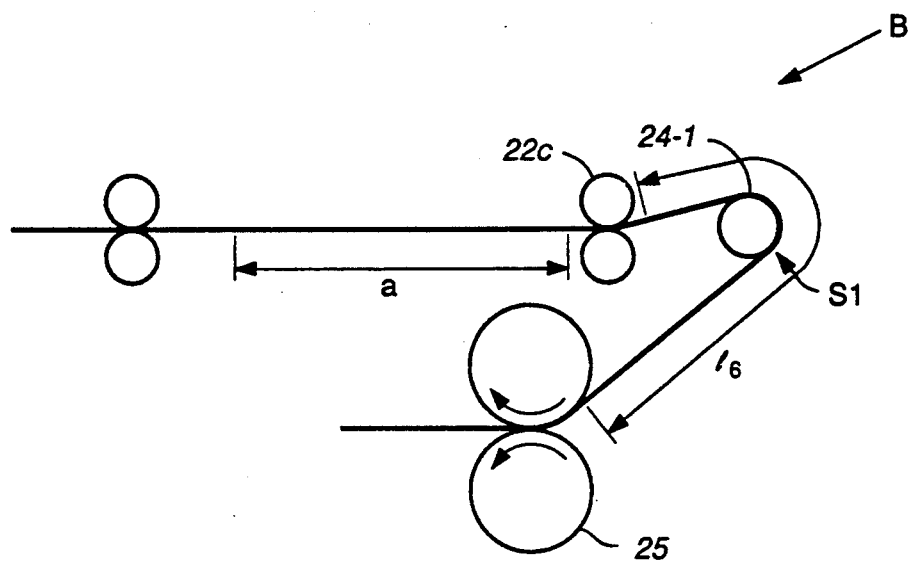
FIG._8F
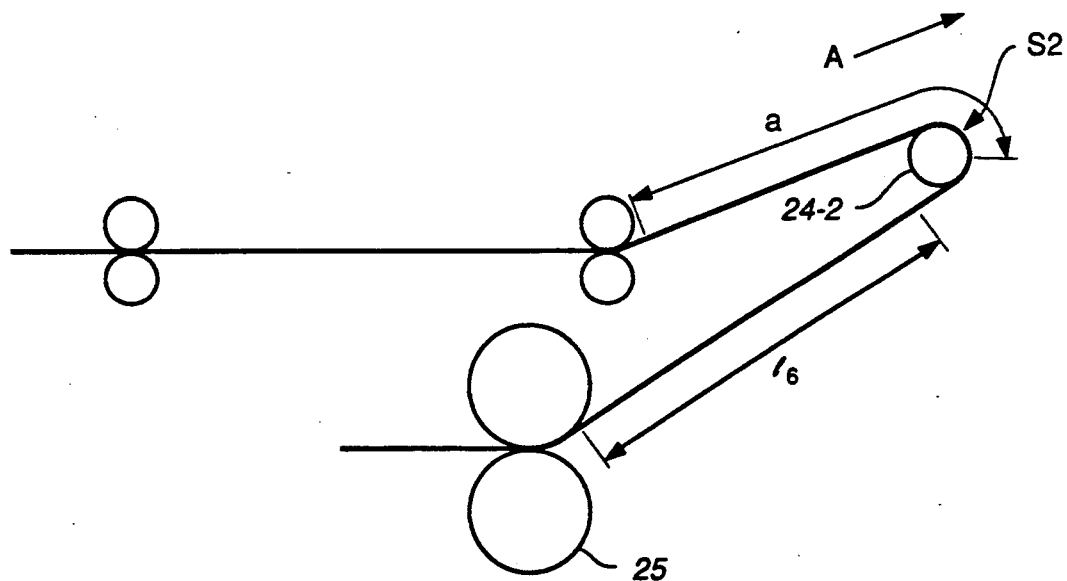
FIG._8G

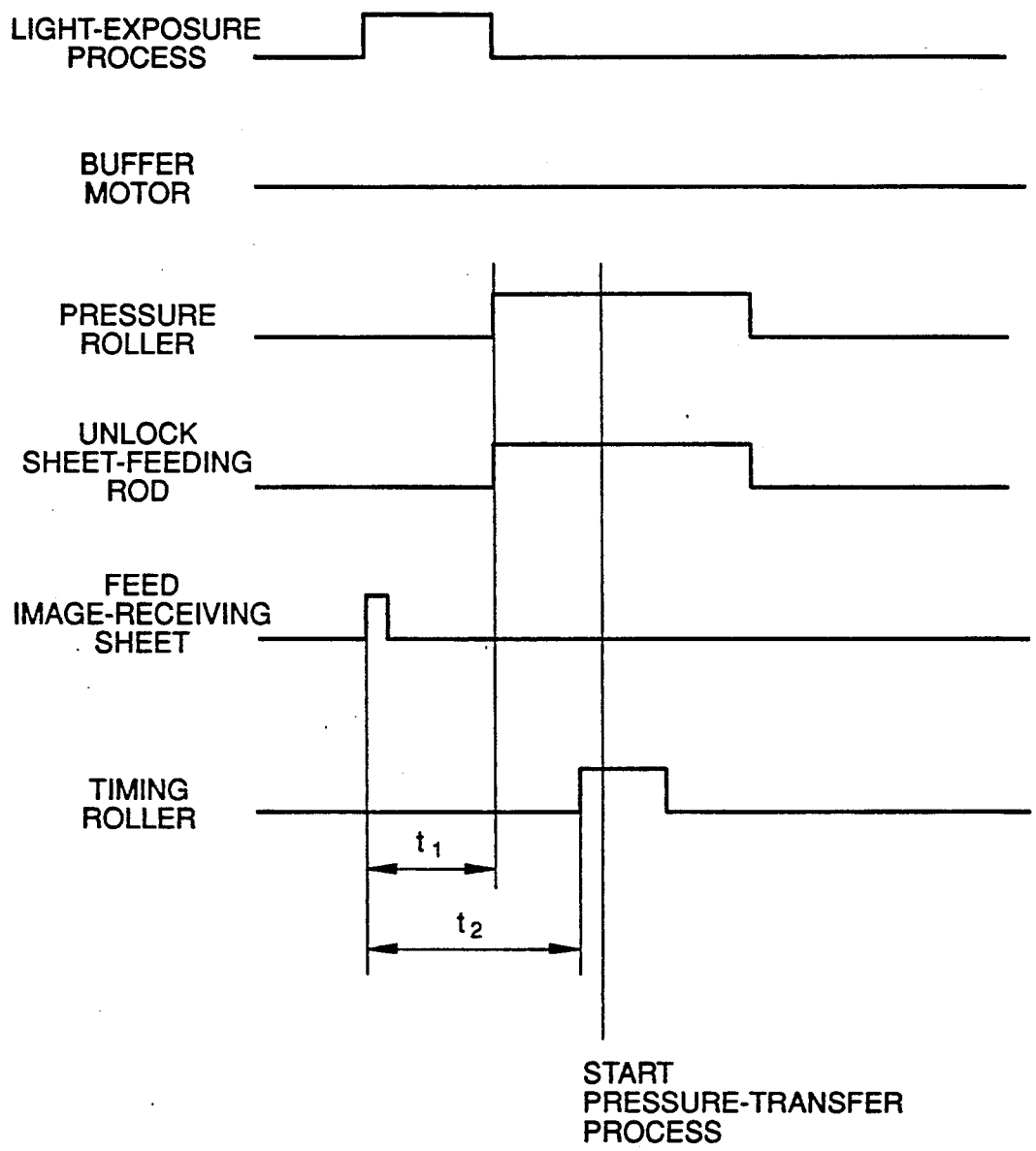
FIG._9A

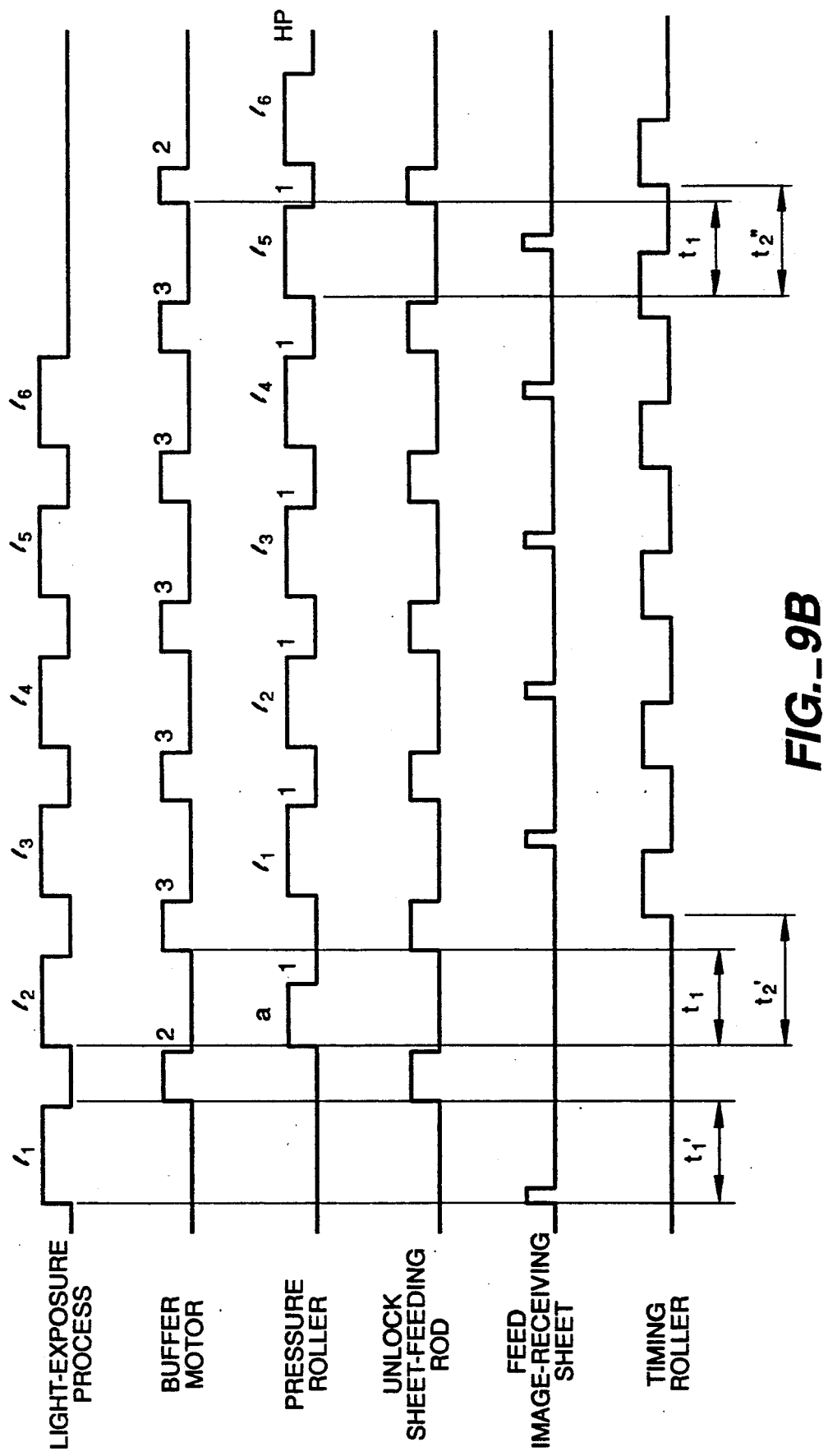
FIG._9B

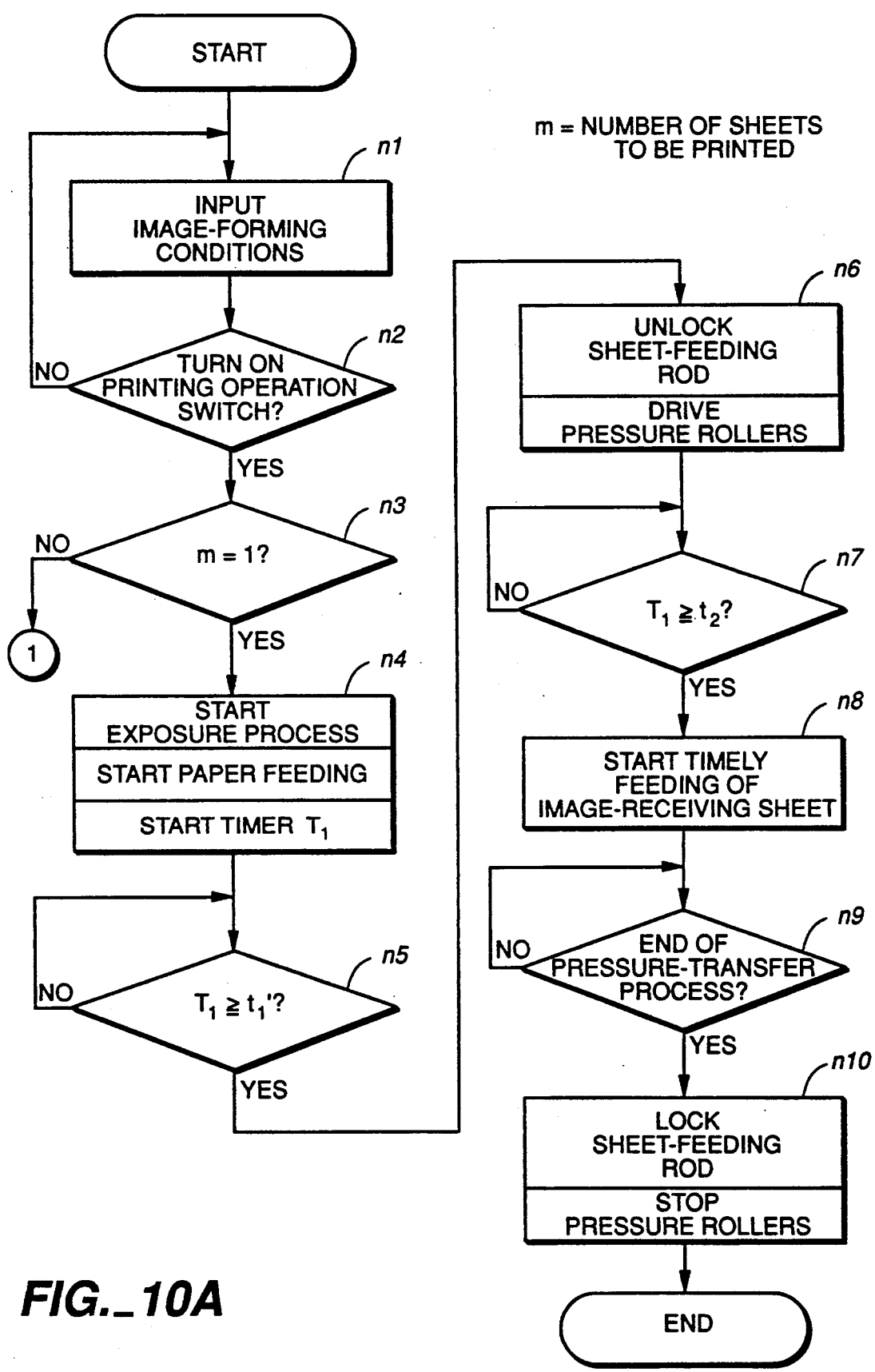
FIG._10A

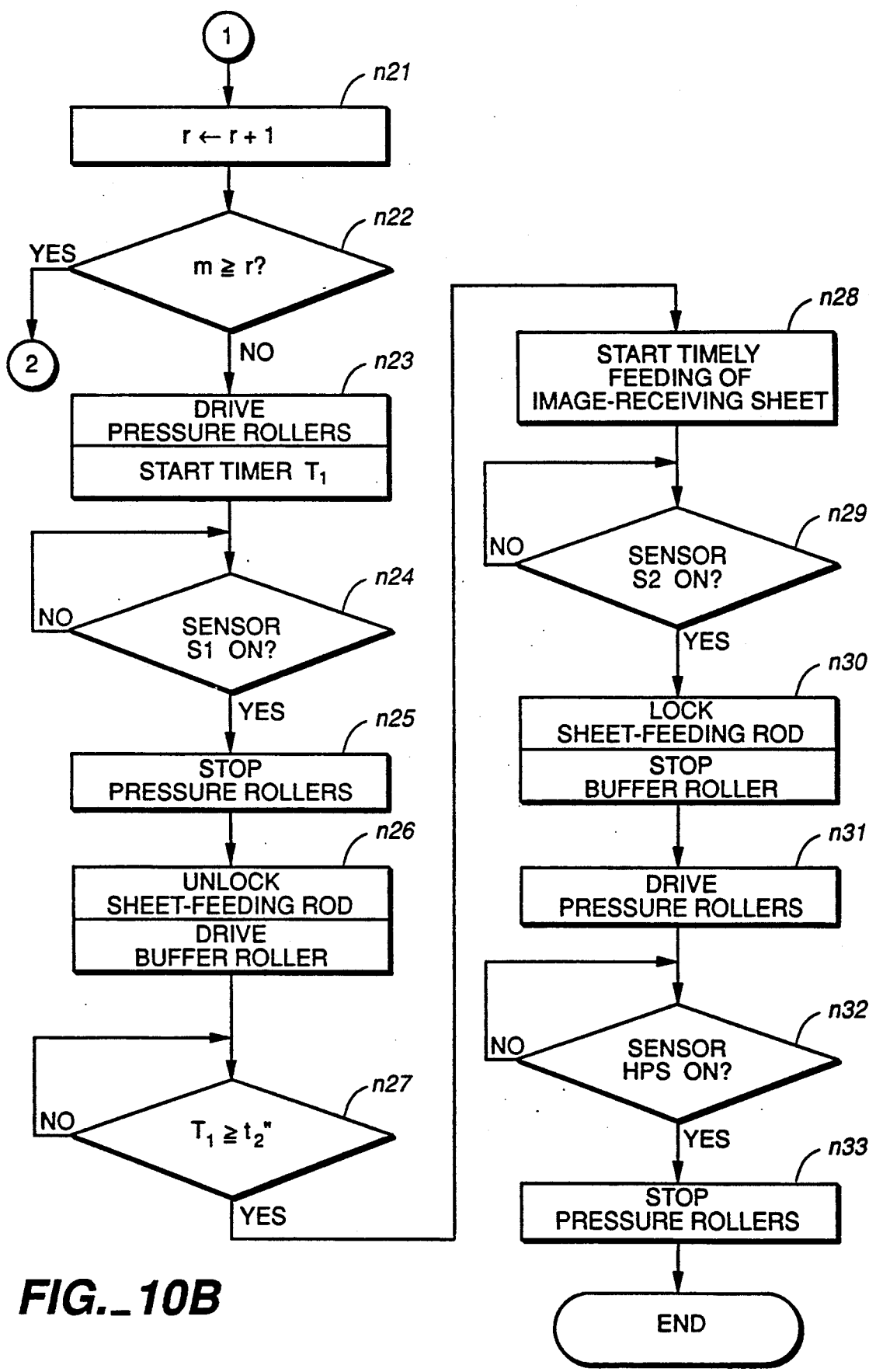
FIG._10B

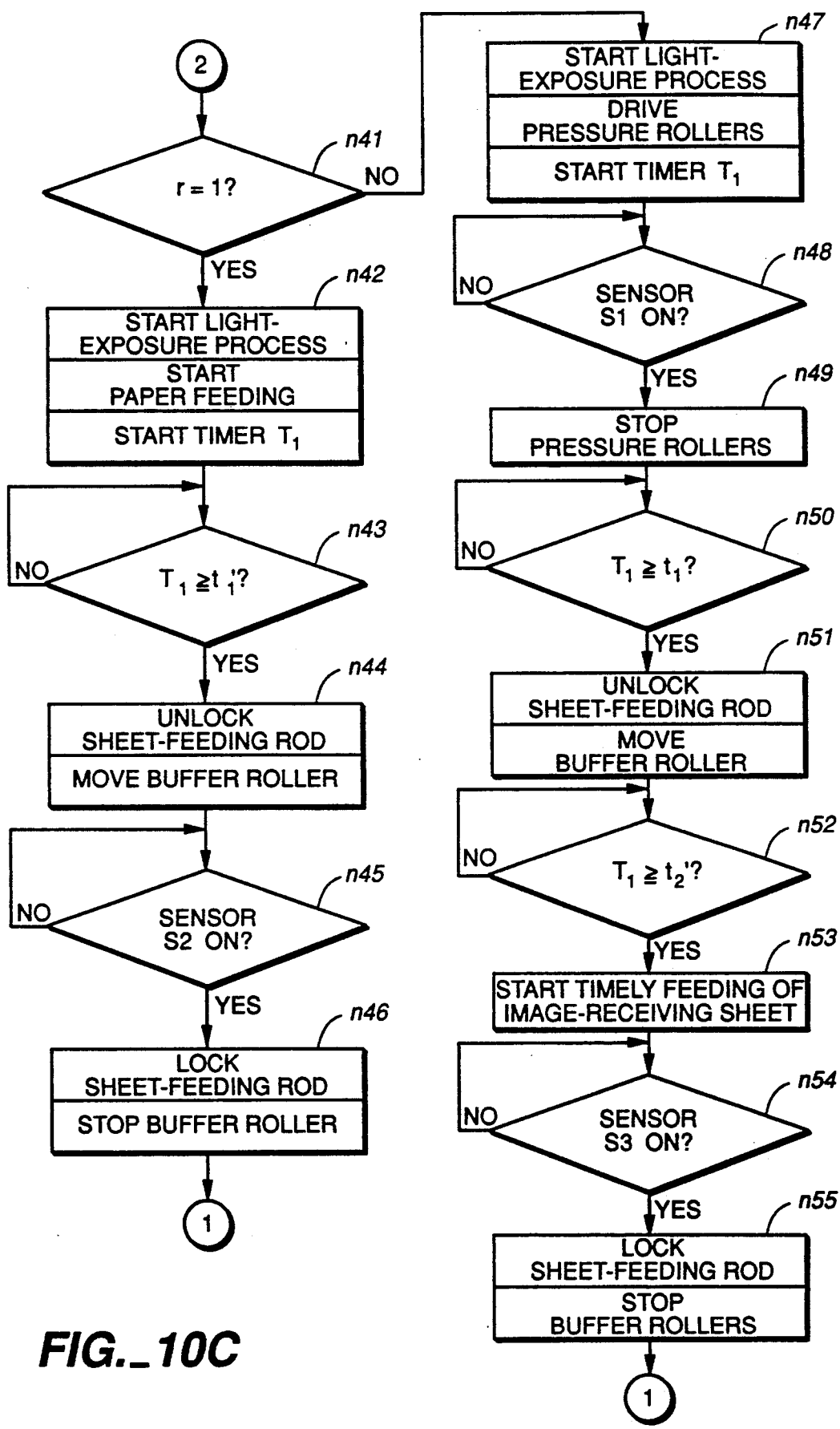
FIG._10C

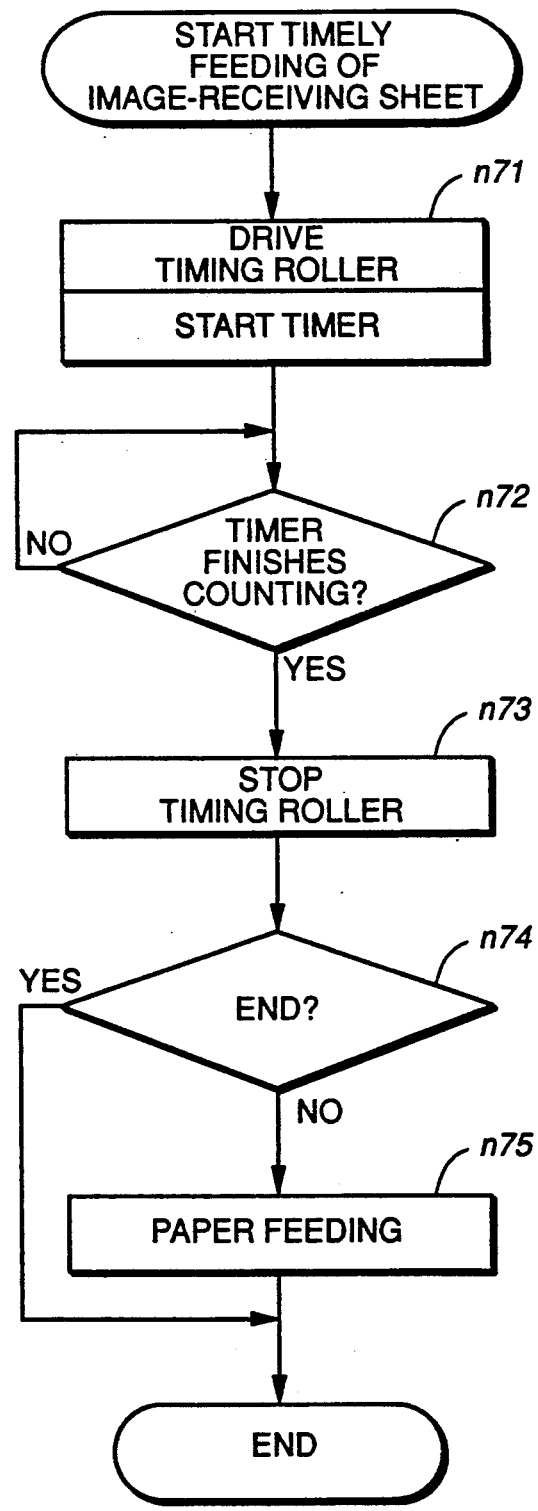
FIG._10D

METHOD FOR THE SIMULTANEOUS OPTICAL STORAGE OF A FIRST IMAGE, OPTICAL RETRIEVAL AND LATENT FORMATION OF A SECOND IMAGE, AND DEVELOPMENT OF A LATENT THIRD IMAGE

BACKGROUND OF THE INVENTION

1. Field of the invention

This invention relates to a method for the formation of images that utilizes optical image memories on which writing and reading of image information is performed by means of light, the image information read out therefrom in the form of light being used for an image forming process.

2. Description of the prior art

An apparatus for the formation of images in which optical image memories (an intermediate storage medium), formed of liquid crystals, PLZT, or the like, is used has been proposed by Japanese Laid-Open Patent Publication No. 54-140542. In such an apparatus, image information is written into the optical image memories and light is directed thereto to extract the stored image information in the form of reflected or transmitted light (image-information light), the image-information light thus obtained being projected onto a photosensitive means for forming a latent image thereon. The image information written in the optical image memories is retained for a certain duration of time. Therefore, in the case of making multiple copies of a plurality of originals, for example, it is possible to write the information of the original images into a plurality of optical image memories, respectively, and then to read out each image information from the corresponding optical image memory for a plurality of image forming processes.

There have previously been two methods for making multiple copies of a plurality of originals: one method is to first write the information of all the original images to be printed into a plurality of optical image memories, and then read out the stored image information sequentially for forming respective images for the multiple image forming processes; and the other method is to first write the image information of a single original image to be printed, and read out the information for forming an image for the first copy, only the image reading operation being sequentially performed for forming images for the second and subsequent copies, and then to repeat this operation for other original images to be printed. In these methods, however, loss is caused in apparent time since no actual image forming process is performed during the writing of image information.

SUMMARY OF THE INVENTION

The method for the formation of images of this invention, which overcomes the above-discussed and numerous other disadvantages and deficiencies of the prior art, utilizing a plurality of optical image memories into each of which image information is written and from each of which said image information is read out sequentially to obtain image-information light that is used for the formation of images; wherein said image information written into one of said optical image memories is read out therefrom at the time when other image information is being written into another predetermined optical image memory.

In a preferred embodiment, the number of said optical image memories is three, into each of which said image information corresponding to one of three primary colors of light is respectively written.

In a preferred embodiment, each of the optical image memories is made of a smectic liquid crystal device.

In a preferred embodiment, the image information is written into said optical image memories by means of a semiconductor laser device.

In a preferred embodiment, the image information light obtained from said optical image memories is projected onto a photosensitive and pressure-sensitive sheet.

Thus, the invention described herein makes possible the objective of providing a method for the formation of images in which the writing of image information into an optical image memory is performed simultaneously with the reading of other image information from another optical image memory, thus eliminating the loss in the processing time and, as a result, shortening the image forming time as a whole.

BRIEF DESCRIPTION OF THE DRAWINGS

This invention may be better understood and its numerous objects and advantages will become apparent to those skilled in the art by reference to the accompanying drawings as follows:

FIG. 1 is a sectional front view of an apparatus for the formation of images that is used in a method of the invention.

FIG. 2 is an enlarged view of an exposure plate and its adjacent parts of the apparatus for the formation of images shown in FIG. 1.

FIG. 3 is a block diagram of a control system for an image-forming process section and for an optical system of the apparatus for the formation of images that is used in the method of the invention.

FIG. 4 is a perspective view illustrating the optical system of the apparatus for the formation of images that is used in the method of the invention.

FIGS. 5 and 6 are diagrams showing the characteristics and construction of the optical image memory of the optical system shown in FIG. 4.

FIGS. 7A to 7D are diagrams illustrating the steps of writing and reading of image information in the optical image memories shown in FIGS. 4, 5, and 6.

FIGS. 8A to 8G are diagrams illustrating the transportation of a photosensitive sheet at the time of an image forming operation.

FIG. 9A is a timing chart for an image forming process of a single printing operation.

FIG. 9B is a timing chart for an image forming process of a multiple printing operation.

FIGS. 10A to 10D are flowcharts illustrating the procedure of the image forming process.

DESCRIPTION OF THE PREFERRED EMBODIMENTS

One embodiment of the present invention will be described below, taking the case of an apparatus for the formation of images in which image-information light extracted from optical image memories is projected onto a full-color compatible photosensitive sheet for forming an image.

The full-color compatible photosensitive sheet, as disclosed for example in Japanese Laid-Open Patent Application No. 59-30537, is formed from a resin such as a polyester or the like, and coated with three kinds of uniformly dispersed pressure-rupturable capsules, each corresponding to one of three primary colors. The three kinds of pressure-rupturable capsules are: (1) C capsules comprising a resin capsule which contains a photosensitive material that is hardened by light with wavelengths in the red region of light and a chromogenic material that gives cyan color by reacting with a developing material (coated on an image-receiving sheet later described); (2) M capsules comprising a resin capsule which contains a photosensitive material that is hardened by light with wavelengths in the green region of light and a chromogenic material that gives magenta color by reacting with the developing material; and (3) Y capsules comprising a resin capsule which contains a photosensitive material that is hardened by light with wavelengths in the blue region of light and a chromogenic material that gives yellow color by reacting with the developing material. Thus, when these capsules receive three kinds of light each with wavelengths in one of the red, green, and blue regions of light, the C, M, and Y capsules are hardened, respectively, in response to each kind of light. When the photosensitive sheet is exposed to three kinds of image forming light (i.e., image-information light that contains the information of an image to be formed) each having wavelengths of one of the red, green, and blue region of light, the C, M, and Y capsules are selectively illuminated with their respective light in accordance with the information of the image to be formed, so that some of the pressure rupturable capsules receive the light and become hardened and others do not receive the light and remain unchanged. As a result, a latent image that consists of hardened C, M, and Y capsules and unhardened C, M, Y capsules is formed on the photosensitive sheet.

The image-receiving sheet is coated with a thermoplastic material and the above-mentioned developing material that is used to color the chromogenic material enclosed in the C, M, and Y capsules. The chromogenic material and the developing material are, for example, leuco dyes and acids that color the dyes (e.g., Japanese Laid-Open Patent Publication No. 58-88739).

When the photosensitive sheet with a latent image formed thereon is pressed against the image-receiving sheet, unhardened pressure-rupturable capsules rupture, causing chromogenic materials enclosed therein to flow out and give colors through reaction with the developing materials on the image-receiving sheet, thus forming a colored image on the image-receiving sheet.

General construction of an apparatus for the formation of images

FIG. 1 shows an apparatus for the formation of full-color images that is used in a method of the invention.

An optical system is disposed in the upper part of the body of the apparatus, the optical system including an image writing device 11 and an image reading device 12. The image writing device 11 is provided, as described below, with optical image memories and a laser unit for writing image information into each of the optical image memories. A laser beam is projected onto one side of each optical image memory for writing the image information thereinto, and light is projected onto the other side thereof for reading out the image information therefrom. The image reading device 12 comprises a light source 12a, lenses 12b and 12c, mirrors 12d and 12e, and a color separation filter 12f. Image information is written into the optical image memories by means of the image writing device 11, and the image information is read out in the form of reflected light by means of the image reading device 12 for illuminating a photosensitive sheet to obtain a latent image thereon. The optical system will be described in detail later.

An image forming process section is disposed in the lower part of the body of the apparatus. In the center of the lower part of the body is mounted a cartridge 21 in such a way as to be removable from the body. The cartridge 21 includes a sheet-feeding rod 21a and a take up rod 21b, the sheet-feeding rod 21a being loaded with a new photosensitive sheet in a rolled form thereon. The photosensitive sheet is full-color compatible as previously mentioned. The photosensitive sheet is drawn out from the sheet-feeding rod 21a, and directed through transport rollers 22a and 22b, an exposure plate 23, a pair of transport rollers 22c, a buffer roller 24, and a pair of pressure rollers 25, before being wound around the take up rod 21b. On the exposure plate 23, the photosensitive sheet is exposed to image forming light from the image reading device 12 so as to obtain a latent image thereon. An entire surface exposure method being employed, the photosensitive sheet is made to stay stationary on the exposure plate 23 after being delivered in a predetermined length from the cartridge 21. At this stage, the light reflected from the entire surface of each optical image memory is projected onto the entire image-forming area, thereby selectively illuminating the image-forming area. As a result, some of the pressure-rupturable capsules receive the light to be hardened and others do not receive the light and remain unchanged, resulting in a latent image. The entire surface exposure thus performed helps to shorten the total exposure time as compared with exposure by scanning.

The photosensitive sheet with the latent image formed thereon is pressed against the image-receiving sheet by means of the pressure rollers 25, which causes the unhardened pressure-rupturable capsules to rupture, thereby allowing the chromogenic materials therein to flow out onto the image-receiving sheet. The image-receiving sheet is delivered from a paper cassette 26 mounted on the right side of the body of the apparatus. The buffer roller 24 is operated for simultaneously performing the light-exposure and pressure-transfer operations; this operation will be described later.

The image-receiving sheet accommodated in the paper cassette 26 is delivered by means of a paper feed roller 26a till it temporarily stops at a timing roller 26b. The timing roller 26b is then started for rotation at a predetermined timing to feed the image-receiving sheet so that the image-receiving sheet is placed on the latent image of the photosensitive sheet for being pressed together by the pressure rollers 25. This causes the unhardened pressure-rupturable capsules of the latent image on the photosensitive sheet to rupture, and thus the chromogenic materials enclosed therein to flow out onto the image-receiving sheet and react with the developing materials, thereby forming a colored image on the image-receiving sheet. Thereafter, the photosensitive sheet is taken up on the take up rod 21b, while the image-receiving sheet is transported by a transport belt 28 and then through a glossing unit 29 before being discharged out of the body onto a paper-receiving tray 30.

The glossing unit 29 includes a glossing belt 29c applied between rollers 29a and 29b, a pressure roller 29d which is pressed against the roller 29b with the glossing belt 29c interposed therebetween, and a fan 29e facing the roller 29a. A heat source such as a halogen lamp is provided inside the roller 29b, the surface temperature thereof being kept between 100 and 200 degrees Centigrade. The image-receiving sheet discharged from the pressure rollers 25 is transported along the glossing belt 29c. The image-receiving sheet is heated while being pressed between the roller 29b and the pressure roller 29d, thereby causing the thermoplastic material coated on the image-receiving sheet to soften and cover the colored image surface, which is smoothened to give glossiness to the colored image (Japanese Laid-Open Patent Publication No. 60-259490). Also, the heating accelerates the coloring reaction between the chromogenic materials and the developing materials (Japanese Laid-Open Patent Publication No. 61-24495), thus giving clearness to the image.

Provided on one end of the sheet-feeding rod 21a of the photosensitive sheet is a sawtooth-like engaging portion with which an actuator 21d engages. The actuator 21d is made to swing by the action of a solenoid 21e. When the solenoid 21e is de-energized, the actuator 21d swings to be engaged with the sheet-feeding rod 21a, so that the sheet-feeding rod 21a is locked to prevent the photosensitive sheet from being drawn out from the cartridge 21. When the solenoid 21e is energized, the actuator 21d is disengaged to unlock the sheet-feeding rod 21a to allow the photosensitive sheet to be drawn out from the cartridge 21.

FIG. 2 is an enlarged view of the exposure plate 23, on the top surface of which are disposed discharge brushes 27a and 27c. The discharge brush 27a is disposed upright on the upstream end (viewed in terms of the transporting direction of the photosensitive sheet) of the exposure plate 23, and the discharge brush 27c is disposed upright on the downstream end thereof. The discharge brushes 27a and 27c are respectively fixed to paper guides 27b and 27d disposed above the photosensitive sheet. The discharge brushes 27a and 27c eliminate the static electricity generated through friction of the photosensitive sheet with the exposure plate 23 during the transportation of the photosensitive sheet. The discharge brushes 27a and 27c also block stray light from entering the center portion of the exposure plate 23, thus preventing exposure of the photosensitive sheet to the stray light.

FIG. 3 is a block diagram of the control system of the apparatus for the formation of images. The apparatus is provided with two CPUs 41 and 51. The CPU 41 controls the image forming process section that includes the photosensitive sheet transport system, the image-receiving sheet transport system, the glossing unit, etc., as well as the input/output to and from an operation section (input section), and thence controls the buffer roller 24, the pressure rollers 25, etc., in accordance with the number of sheets to be printed, or other image forming conditions that are input to the operation section. The CPU 51 is provided to control the optical system. Image data is input to the CPU 51 from a scanner, computer, etc., which are peripheral devices to the apparatus for the formation of images. The image data consists of digital data separated into three primary color components, red (R), green (G), and blue (B), which, under the control of the CPU 51, are stored as image information in an R area, a G area, and a B area of an image memory 52, respectively. Then, in the image writing operation, each of the stored image information corresponding to R, G, and B is written into the respective optical image memories using the image writing device 11 that includes a semiconductor laser unit.

Construction of the optical system

FIG. 4 shows the image writing device 11 and its adjacent parts.

The image writing device 11 includes three optical image memories 31R, 31G, and 31B. Each of the optical image memories 31R, 31G, and 31B is formed for example from a smectic liquid crystal device.

(1) Description of the smectic liquid crystal device

FIG. 5 shows the thermoelectro-optic characteristics of the smectic liquid crystal device.

A smectic liquid crystal device comprises two glass substrates between which smectic A-type liquid crystals having positive dielectric anisotropy are sandwiched. The electrode surface on the inner side of each substrate is appropriately treated so that the liquid crystal molecules are aligned perpendicular to the plane of the substrate (state (T) as shown in upper left in FIG. 5). In this state, the device is transparent. When the entire liquid crystal device is slowly heated, the transparency of the device slowly increases and then reaches saturation (as shown in upper right in FIG. 5). In this state, the molecular alignment in the liquid crystal is completely random. The liquid is now in an isotropic state, and not a liquid crystal. Next, when this liquid is slowly cooled, the following two stable states are obtained depending on the way it is cooled.

A) When the device is cooled without applying voltage between the electrodes, the molecules in the device align partly in a smectic state (focal conic). As a result, the device turns to be opaque (state (F) as shown in lower left in the FIG. 5).

B) On the other hand, when the device is cooled while applying a sufficiently great high-frequency voltage between the electrodes, the liquid crystal molecules come to be aligned perpendicular to the plane of the substrates, thus returning to the original smectic A state. That is, the device becomes transparent. This is because the liquid crystal molecules have positive dielectric anisotropy and therefore align parallel to the applied electric field.

The above states described in A) and B) are retained as long as required even after removal of the voltage applied between the electrodes, provided that the ambient temperature of the liquid crystal device is controlled so as not to exceed the phase transition temperature $T_{N1}$.

There are two ways to bring the device from the state (F) (opaque state) back to the state (T) (transparent state) shown in FIG. 5.

C) The liquid crystal device is reheated till the liquid crystals turn into liquid, and then cooled while applying a sufficiently high voltage between the electrodes.

D) An extremely high voltage is applied between the electrodes to forcibly bring the device from the state (F) back to the state (T). In this case, the liquid crystal device must be kept at the same temperature as the ambient temperature.

Using the above characteristics, it is possible to write and erase optically readable (transparent or opaque) image information in a smectic liquid crystal device through selective application of voltage and heat. Voltage can be selectively applied to any specified pixels by scanning matrix electrodes arranged on the glass substrates, while heat can be applied to any specified pixels using a laser beam.

FIG. 6 is a diagram showing the construction of any of the above smectic liquid crystal devices (optical image memories) 31R, 31G, and 31B. The liquid crystal device comprises two glass substrates 3a, a smectic liquid crystal layer 3b sandwiched therebetween, a transparent electrode 3c disposed on the left side of the liquid crystal layer 3b, an aluminum reflective film 3d disposed on the right side of the liquid crystal layer 3b, and a $Cr_2O_3$ absorption film 3e, which is a laser beam absorption film, disposed on the right side of the aluminum reflective film 3d. The transparent electrode 3c and the aluminum reflective film 3d constitute matrix electrodes as used in a known liquid crystal display, one of which serves as the scanning electrode and the other as the signal electrode, the electrodes being scanned by a high-frequency voltage 3f. Thus, it is possible to make the portion where the scanning and signal electrodes intersect function as a pixel, and to apply an electric field to any selected pixel by controlling the signal wave applied to the electrodes. Disposed on the right side of the liquid crystal device are a semiconductor laser unit and a converging lens for heating a selected pixel with a laser beam. It is therefore possible to heat any selected pixel by scanning with the laser beam and by turning on and off the laser beam.

When light is projected onto the liquid crystal device from the left side (the reading side), the light is not reflected by the portion of the device where the liquid crystal layer 3b is in a molecule-diffused state (opaque state), but the light is reflected by the portion where it is in a liquid or transparent state because the light is transmitted through to the aluminum reflective film 3d and is reflected by this reflective film 3d.

(2) Description of the image writing unit and its adjacent parts

Referring to FIG. 4, the image writing device 11 includes a semiconductor laser unit 32. The semiconductor laser unit 32 receives image information stored in the image memory 52, and emits a laser beam, the on-and-off operation of which is controlled according to the image information. The laser beam is reflected by a mirror 32b provided on a goniometer 32a, passes through a pickup lens (converging lens) 32c having a focusing function, and is projected onto one of the optical image memories (liquid crystal devices) 31R, 31G, or 31B. The goniometer 32a is used for the scanning operation of the laser beam.

The light source 12a, the lenses 12b and 12c, and the color separation filter 12f (a part of the image reading device) are disposed on the right side of the optical image memories 31R, 31G, and 31B. The color separation filter 12f is a disk-shaped frame having an R filter 12f-R that transmits the light with wavelengths in the red region of light, a G filter 12f-G that transmits the light with wavelengths in the green region of light, and a B filter 12f-B that transmits the light with wavelengths in the blue region of light. By rotating the color separation filter 12f, one of the three filters is positioned to face the light reflected from one of the optical image memories. In practice, the R filter 12f-R faces the optical image memory 31R, the G filter 12f-G faces the optical image memory 31G, and the B filter 12f-B faces the optical image memory 31B. Therefore, when reading the image information stored in the optical image memory 31R, for example, only the light with wavelengths in the red region of the light reflected therefrom is transmitted through the color separation filter 12f, for illuminating the photosensitive sheet.

The optical image memories 31R, 31G, and 31B are fixed to a support block 31 which is movable along a rail 33. A linear motor 34 is provided for moving the support block 31 along the rail 33, and under the control of this motor, each of the three optical image memories 31R, 31G, and 31B in this order is positioned to face the radiation area of the semiconductor laser unit 32 or the light source 12a. It is so constructed that the optical image memory which is positioned to face the semiconductor laser unit 32 is different from the one that is positioned to face the light source 12a. In this embodiment, when the Nth optical image memory is positioned to face the semiconductor laser unit 32, the (N−1)th optical image memory is positioned to face the light source 12a. In FIG. 4, the optical image memory 31R is positioned to face the light source 12a, while the optical image memory 31G is positioned to face the semiconductor laser unit 32.

Image information written in the optical image memories 31R, 31G, and 31B will be retained for a long period of time. Therefore, the image information once written into any optical image memory using the semiconductor laser unit 32 can be extracted as many times as desired using the light source 12a (of the image reading device).

(3) Description of the operation of the optical system

FIGS. 7A to 7D show the procedure of the operation in which image information is written into and read out from the optical image memories 31R, 31G, and 31B. The following describes how the writing and reading operations are performed.

First, the optical image memory 31R is positioned to face the semiconductor laser unit 32, and image information stored in the R area of the image memory 52 is written into the optical image memory 31R using the semiconductor laser unit 32, as shown in FIG. 7A. After the writing operation is completed, the support block 31 moves so that the optical image memory 31G is positioned to face the semiconductor laser unit 32, and the optical image memory 31R to face the light source 12a, thus performing the writing of image information (stored in the G area of the image memory 52) into the optical image memory 31G simultaneously with the reading of the image information just written in the optical image memory 31R, as shown in FIG. 7B. The next step proceeds in the same manner, in which the writing of image information (stored in the B area of the image memory 52) into the optical image memory 31B is performed simultaneously with the reading of the image information from the optical image memory 31G, as shown in FIG. 7C. In the final step, the reading of the image information from the optical image memory 31B is performed, as shown in FIG. 7D, to complete the writing and reading operations.

With the simultaneous performance of the reading and writing operations as described above, it is possible to shorten the total processing time as compared with the case in which these operations are performed separately. In the case of the above example in which three optical image memories are used, the total time can be shortened by the time required for the two writing operations shown in FIGS. 7B and 7C.

The photosensitive sheet transport system and its operation (1) The construction of the photosensitive sheet transport system FIGS. 8A to 8G show the construction of the photosensitive sheet transport system, illustrating the respective steps of the transportation of the photosensitive sheet.

It is assumed here that l denotes the length of the photosensitive sheet to be positioned on the exposure plate 23 so as to be subjected to the light-exposure process. In the case of a continuous image forming operation on the photosensitive sheet, image-forming areas $l_1$, $l_2$, etc., each having the light-exposure length l, are successively allocated on the photosensitive sheet, the first latent image being formed on the image-forming area $l_1$, the second latent image on the image-forming area $l_2$, and so on. Non-image areas b are disposed separating the image-forming areas $l_1$, $l_2$, etc. from one another. The photosensitive sheet transport system is controlled so that the transportation of the photosensitive sheet will be suspended in such a manner that the non-image areas b are positioned at the transport rollers 22b, the transport rollers 22c, and the pressure rollers 25, respectively.

It is also assumed here that a denotes the area on the photosensitive sheet that stays between the transport rollers 22c and the pressure rollers 25 at the beginning of the image forming process. Since no image is usually formed on this area, it is desirable to keep the length of a as short as possible. A non-image area b is also disposed between the area a and the image-forming area l, and the photosensitive sheet transport system is controlled so that the transportation of the photosensitive sheet will be suspended in such a manner that this non-image area b is also positioned either at the transport rollers 22b, the transport rollers 22c, or the pressure rollers 25.

The buffer roller 24 disposed downstream of the exposure plate 23 and transport rollers 22c is movable in the directions of arrows A and B shown in FIG. 8A. A motor (not shown) is provided for this linear movement of the buffer roller 24. The buffer roller 24, usually positioned in the home position (hereinafter called the HP), moves to positions 24-1, 24-2, and 24-3, being driven by the motor. Upper right to the buffer roller 24 is a buffer section where the photosensitive sheet is transported by the buffer roller 24 moving to the positions 24-1, 24-2, and 24-3. The length of the photosensitive sheet transported into the buffer section is determined by the position of the buffer roller 24, the length being approximately equal to the image-forming area (light-exposure length) l with the buffer roller 24 being at the position 24-1 as shown in FIG. 8C, and approximately double the image-forming area (light-exposure length) l with the buffer roller 24 being at the position 24-3 as shown in FIG. 8D. Sensors S1, S2, S3, and HPS are provided to detect the position of the buffer roller 24. The sensors S1, S2, S3, and HPS are activated when the buffer roller 24 comes to the positions 24-1, 24-2, 24-3, and HP, respectively.

(2) The operation of the photosensitive sheet transport system at the time of the image forming process FIGS. 10A to 10D are flowcharts illustrating the procedure of the image forming process. FIGS. 9A and 9B are timing charts for the image forming process.

Single printing operation

When an image is formed on a single image-receiving sheet with use of the apparatus that is used in the method in the invention, the buffer roller 24 remains at the HP. FIG. 9A is a timing chart illustrating the single printing operation, and FIG. 10A shows the procedure thereof.

Referring to FIG. 10A, when the printing operation switch is turned on after the number m of the sheets to be printed and other image forming conditions are input in steps n1 and n2, the image forming process is started according to the number m of the sheets to be printed. When the number m is 1, i.e., a single sheet is to be printed (step n3), the process proceeds to step n4 in which the exposure process, paper feeding, and a timer $T_1$ are started. The "paper feeding" means the delivery of the image-receiving sheet from the paper cassette 26 by the rotation of the paper feed roller 26a, the delivered sheet being temporarily stopped at the timing roller 26b. The exposure process is controlled by the CPU 51.

When the exposure process is started, image information is written into and read out from the optical image memories 31R, 31G, and 31B in accordance with the procedure shown in FIGS. 7A to 7D, so that the image-information light is projected onto the photosensitive sheet to form a latent image thereon corresponding to the original full-color image. The exposure light (the image-information light) is projected over the area $l_1$ shown in FIG. 8A. The time needed for the exposure process is approximately $t_1'$.

After completion of the exposure process (step n5), the pressure-transfer process starts; i.e., the image-receiving sheet is pressed against the latent image formed on the area $l_1$, of the photosensitive sheet. The procedure of this pressure-transfer process will now be described. First, in step n6, the sheet-feeding rod 21c of the photosensitive sheet is unlocked (the solenoid 21e is energized), and at the same time, the pressure rollers 25 are started for rotation. Then, the photosensitive sheet, being pulled by the rotation of the pressure rollers 25, is drawn out from the cartridge 21. The photosensitive sheet is delivered out by the combined length of the areas a and $l_1$. During the delivery of the photosensitive sheet, the image-receiving sheet, which has been conveyed from the paper cassette 26 into the timing rollers 26b in the preceding paper feeding operation of the step n4, is transported into the pressure rollers 25 to be pressed against the image-forming area $l_1$ to form a colored image on the image-receiving sheet. The feeding of the image-receiving sheet is therefore started in step n8 with such timing that the image-receiving sheet is fed so as to be accurately placed on the image-forming area $l_1$ for the pressure-transfer process. The above timely feeding of the image-receiving sheet is started when the timer $T_1$ that was started at the beginning of the exposure process counts up to $t_2$ (step n7).

FIG. 10D is a flowchart illustrating the above-mentioned timely feeding of the image-receiving sheet, which is carried out by the rotation of the timing rollers 26b. In step n71, a timer starts at the same time that the timing roller 26b is started for rotation. When the time needed for the feeding of the image-receiving sheet of the length l elapses in step n72, the timing rollers 26b stop in step n73 to complete the timely feeding of the image-receiving sheet. After feeding the image-receiving sheet from the timing rollers 26b, if the feeding is not the last one (step n74), the paper feed roller 26a is again put into operation for feeding another image-receiving sheet from the paper cassette 26 in step n75. In the single printing operation, since only a single image forming process is performed, another paper feeding operation (step n75) is not performed.

Referring back to FIG. 10A, after completion of the pressure-transfer process (step n9), the sheet-feeding rod 21c of the photosensitive sheet is locked, and the pressure rollers 25 are stopped in step n10, so that the photosensitive sheet cannot be drawn out or transported any more. This is the end of the single printing operation. At this time, the next image-forming area is positioned on the exposure plate 23.

Multiple printing operation

FIG. 9B is a timing chart for a multiple printing operation, and FIGS. 10A to 10D show the procedure thereof. The following description deals with a multiple printing operation for printing 6 sheets. In the multiple printing operation, the buffer roller 24 is moved in such a way that the image-forming area with a latent image formed thereon is first drawn out into the buffer section, and then fed to the pressure rollers 25 for the pressure-transfer process while the light-exposure process is being performed on another image-forming area of the photosensitive sheet. Since the light-exposure and pressure-transfer processes are simultaneously performed, it helps to speed up the image forming operation as a whole. In FIG. 9B, $l_1$, $l_2$, etc. indicate the image-forming areas which are positioned on the exposure plate 23 to be exposed to light or which pass through the pressure rollers to be pressed against an image-receiving sheet at the time of the corresponding processes. Also, the numeral attached to the upper right corner at the end of each operating period of the buffer motor and the pressure rollers indicates the position of the buffer roller at the end of that operation (i.e., the numeral 1 denotes the position 24-1 of the buffer roller 24 shown in FIG. 8, 2 denotes the position 24-2, and 3 denotes the position 24-3).

Referring to FIG. 10A, the printing operation switch is pressed after the image forming conditions are input (steps n1, n2). If the number m of the sheets to be printed with an image is more than 1 (in step n3), the process proceeds to step n21 of FIG. 10B, in which 1 is added to the number r of the light-exposure processes that have been completed, the further process being performed according to that value.

For exposure for the first sheet which corresponds to the image-forming area $l_1$, the process proceeds from step n22 of FIG. 10B to step n41 of FIG. 10C and then to step n42, in which the light-exposure process, paper feeding, and timer $T_1$ are started. For the first exposure process, image information is written into and read out from the optical image memories 31R, 31G, and 31B as illustrated in FIGS. 7A to 7D, the time required for the exposure process being approximately $t_1'$. In this first light-exposure process, a latent image corresponding to an original full-color image is formed on the image-forming area $l_1$ which is positioned on the exposure plate 23 as shown in FIG. 8A. At the end of the exposure (step n43), the sheet-feeding rod 21c of the photosensitive sheet is unlocked to allow the photosensitive sheet to be drawn out from the cartridge 21, while the linear movement of the buffer roller 24 is started in step n44. The buffer roller 24 travels in the direction of arrow A shown in FIG. 8B by the driving of the buffer motor till it reaches the position 24-2, where the sensor S2 is activated (step n45). When the sensor S2 is activated, the sheet-feeding rod 21c of the photosensitive sheet is locked, and the buffer roller 24 is stopped, to stop the transportation of the photosensitive sheet in step n46. At this point of time, the portion of the photosensitive sheet holding the area a and the image-forming area $l_1$ with the latent image formed thereon is positioned in the buffer section, and the next image-forming area $l_2$ is positioned on the exposure plate 23 as shown in FIG. 8B.

Thereafter, the process proceeds through steps n21, n22, and n41 to step n47 for the light-exposure process for the second sheet, which corresponds to the image-forming area $l_2$. For exposure for the second and subsequent sheets, since the image information is already written in the optical image memories 31R, 31G, and 31B, only the reading process is required, and thence the time required for the exposure process with reading only is approximately $t_1$. In the step n47, the timer $T_1$ and the light-exposure process for the image-forming area $l_2$ are started, and at the same time, the pressure rollers 25 are driven for rotation, pulling the photosensitive sheet stored in the buffer section into the pressure rollers 25. This causes the buffer roller 24 to move in the direction of arrow B into the position 24-1 as shown in FIG. 8C. Thus, at the time of the exposure for the second sheet, the area a of the photosensitive sheet is fed to the pressure rollers 25 by the rotation of the pressure rollers 25, where neither the feeding of the image-receiving sheet nor the pressure-transfer process is performed.

When the buffer roller 24 is moved in the direction of arrow B into the position 24-1 to activate the sensor S1, the rotation of the pressure rollers 25 stops (steps n48 and n49). At this point of time, the length of the photosensitive sheet equivalent to a single image-forming area (the image-forming area $l_1$) is positioned in the buffer section, as shown in FIG. 8C. After the suspension of the rotation of the pressure rollers 25, when the timer $T_1$ counts up to $t_1$ in step n50, the sheet-feeding rod 21c is unlocked and the buffer roller 24 is driven in step n51 to move in the direction of arrow A to draw out another length of the photosensitive sheet.

For the pressure-transfer process, the timely feeding of the image-receiving sheet by the rotation of the timing roller 26b must be started earlier than the pressure-transfer process starts by a given time, i.e. by the time needed for the image-receiving sheet fed by the timing roller 26b to reach the pressure rollers 25. Therefore, while another length of the photosensitive sheet is being drawn out by means of the buffer roller 24 driven in the step n51, the timely feeding of the image-receiving sheet is started for the first pressure-transfer process that will be performed in one of the succeeding steps later described. In this example, the timer $T_1$, which is started at the beginning of the exposure process for the second sheet, is also used to determine the point of time at which the timely feeding of the image-receiving sheet is started for the first pressure-transfer process. When the timer $T_1$ counts up to $t_2'$ in step n52, the timely feeding of the image-receiving sheet is started in step n53.

When the buffer roller 24, which was driven to move in the direction of arrow A in the step n51, reaches the position 24-3, the sensor S3 is activated in step n54, and the sheet-feeding rod 21c is locked and the buffer roller 24 stops in step n55, thus stopping the delivery of the photosensitive sheet. As a result, the image-forming area $l_2$ on which a latent image has been formed in the second light-exposure process is transported into the buffer section, so that the length of the photosensitive sheet equivalent to two image-forming areas ($l_1$ and $l_2$) is positioned in the buffer section, and the next (third) image-forming area $l_3$ is positioned on the exposure plate 23 for the third exposure process, as shown in FIG. 8D. (This sheet-transporting operation (steps n51, n54, n55) by which an image-forming area with a latent image just formed thereon is transported into the buffer section is hereinafter referred to as the "delivery operation".)

After the completion of the above-mentioned "delivery operation", the process proceeds again to the steps n21, n22, and n41, and back to the step n47 for the third light-exposure process for exposing the third image-forming area $l_3$.

At the time of the third light-exposure process for the image-forming area $l_3$, the image-forming area $l_1$ on which the latent image was formed in the first light-exposure process is transported from the buffer section into the pressure rollers 25 for the first pressure-transfer process (the steps n47–n49), in which the image-receiving sheet is pressed on the latent image of the image-forming area $l_1$, resulting in a colored image on the image-receiving sheet. In this way, after the light-exposure processes for the first and second image-forming areas $l_1$ and $l_2$ are completed, the pressure-transfer process for the first image-forming area $l_1$is performed simultaneously with the light-exposure process for the third image-forming area $l_3$. Since two image-forming areas with latent images thereon are stored in the buffer section before the simultaneous performance of the light-exposure and pressure-transfer processes, the light-exposure process for the Nth image-forming area $l_N$ (N is an integer of 3 or more) is performed simultaneously with the pressure-transfer process for the (N-2)th image-forming area $l_{(N-2)}$.

After the simultaneous performance of the third light-exposure process and the first pressure-transfer process is completed (step n50), the above-mentioned "delivery operation" is performed again so that the image-forming areas $l_2$ and $l_3$ are positioned in the buffer section (steps n51, n54, and n55). In the meantime, the timely feeding of the image-receiving sheet for the second pressure-transfer process is started in step n53.

The above-mentioned simultaneous performance of the light-exposure and pressure-transfer processes and the "delivery operation" are alternately repeated until the sixth (last) image-forming area $l_6$ is transported into the buffer section as shown in FIG. 8E. The time required for the simultaneous light-exposure and pressure-transfer operation and the time for the "delivery operation" are both kept constant during the whole printing process.

The buffer section is thus provided adjoining the exposure plate, the photosensitive sheet that holds latent images being continuously stored in the buffer section, thus preventing the wasteful use of the photosensitive sheet. Since the light-exposure and pressure-transfer processes are simultaneously performed, while performing the delivery of the photosensitive sheet at a relatively high speed in the meantime, the above construction offers the advantage that the total image forming time is shortened. Also, because of the employment of the entire surface exposure method, the above construction offers the further advantage that the light-exposure time is shortened.

When the last "delivery operation" is performed after completion of the exposure for the specified number of image-forming areas (6 image-forming areas) (FIG. 8E), the process proceeds through steps n21 and n22 to step n23, where the pressure rollers 25 are driven for rotation, as has been done theretofore, to perform the pressure-transfer process for the image-forming area $l_5$. As a result, as shown in FIG. 8F, only the image-forming area $l_6$ holding the last latent image is stored in the buffer section. Thereafter, the area a of the photosensitive sheet to be positioned between the transport rollers 22c and the pressure rollers 25 is drawn out into the buffer section, as shown in FIG. 8G (steps n26, n29, and n30). In the meantime, the timely feeding of an image-receiving sheet is started at the specified timing (steps n27 and n28). The image-receiving sheet fed at the specified timing reaches the pressure rollers 25 at the time when the pressure rollers 25 are driven (step n31) for the pressure-transfer process for the last image-forming area $l_6$. When the buffer roller 24 reaches the HP, the sensor HPS is activated so that the rotation of the pressure rollers 25 is suspended (steps n32 and n33), to complete the last pressure-transfer process, the photosensitive sheet transport system being brought back into the original state shown in FIG. 8A.

As described above, according to the invention, the buffer roller is operated to transport the photosensitive sheet for continuous image forming processes so that the area a where no image is formed is not interposed between the image-forming areas $l_1, l_2, \ldots$, thus preventing the wasteful use of the photosensitive sheet.

In this example, description has been given, dealing with the apparatus in which an image forming process is carried out using three optical image memories into which image information of red, green, and blue color components of an original full-color image is written. Alternatively, the image information may be of monochrome, or more than three optical image memories may be used. In that case also, if the construction is so made as to enable simultaneous writing and reading of image information, the processing time can be shortened. Also, in the above-mentioned example, during the writing of the Nth image information, the (N−1)th image information is read out, but alternatively, it may be so designed as to perform the reading of the image information numbered lesser than (N−1), for example, the reading of (N−2) or (N−3) image information.

As described above, according to the present invention, it is possible to simultaneously perform the writing and reading of image information in the optical image memories, thereby saving the apparent time for writing or reading and shortening the image processing time as a whole.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art to which this invention pertains.

What is claimed is:

1. A method for the formation of images, including the steps of:
    a first step of sequentially writing image information into a plurality of optical image memories and sequentially reading out the written image information so as to obtain image information light, the image information light then being used to sequentially expose image-forming areas of a pressure-sensitive and photosensitive sheet to form latent images thereon; and
    a second step of sequentially transporting the image-forming areas of the photosensitive sheet having the latent images formed thereon by the first step into a pressure-transfer section to develop the latent images;
    wherein the developing of one latent image in the second step is performed while the reading out of the written image information is being performed to form another latent image in the first step, and wherein the first step is so performed that the image information written into one of the optical image memories is read out therefrom at the time when other image information is being written into another optical image memory.

2. A method according to claim 1, wherein there are three of said optical image memories, into each of which said image information corresponding to one of three primary colors of light is respectively written.

3. A method according to claim 1, wherein each of said optical image memories is made of a smectic liquid crystal device.

4. A method according to claim 1, wherein said image information is written into said optical image memories by means of a semiconductor laser device.

5. A method according to claim 1, wherein said image information light obtained from said optical image memories is projected onto a photosensitive and pressure-sensitive sheet.

6. A method according to claim 1, wherein one of said image-forming areas which has a latent image formed thereon by the first step is temporarily stored in a buffer section.

7. A method according to claim 6, wherein two of said image-forming areas adjacent to each other and having latent images formed thereon by the first step are temporarily stored in the buffer section.

8. A method according to claim 7, wherein while the preceding one of said two image-forming areas stored in the buffer section is being transported through the pressure-transfer section for the developing of the latent image, another latent image is formed on another image-forming area subsequent to the other one of said two image-forming areas.

* * * * *